(12) United States Patent
Schwendimann et al.

(10) Patent No.: US 9,423,280 B2
(45) Date of Patent: Aug. 23, 2016

(54) SENSOR

(71) Applicant: Baumer Electric AG, Frauenfeld (CH)

(72) Inventors: Mathias Schwendimann, Neuhausen (CH); Erich Hohloch, Aadorf (CH)

(73) Assignee: Baumer Electric AG, Frauenfeld (CH)

( * ) Notice: Subject to any disclaimer, the term of this patent is extended or adjusted under 35 U.S.C. 154(b) by 260 days.

(21) Appl. No.: 13/949,688

(22) Filed: Jul. 24, 2013

(65) Prior Publication Data

US 2014/0026656 A1 Jan. 30, 2014

(30) Foreign Application Priority Data

Jul. 25, 2012 (EP) ..................................... 12177898

(51) Int. Cl.
*G01D 11/24* (2006.01)
(52) U.S. Cl.
CPC ........ *G01D 11/245* (2013.01); *Y10T 29/49128* (2015.01)
(58) Field of Classification Search
CPC ............................ G01D 11/24; G01D 11/245
USPC ......................................................... 73/431
See application file for complete search history.

(56) References Cited

U.S. PATENT DOCUMENTS

| | | | | |
|---|---|---|---|---|
| 5,789,920 | A | * | 8/1998 | Gass ............................. 324/260 |
| 6,317,332 | B1 | * | 11/2001 | Weber et al. ................. 361/760 |
| 2005/0054221 | A1 | * | 3/2005 | Mayer et al. ................ 439/76.1 |
| 2012/0063104 | A1 | * | 3/2012 | Moser et al. ................. 361/757 |

FOREIGN PATENT DOCUMENTS

| | | |
|---|---|---|
| DE | 195 44 815 C1 | 4/1997 |
| DE | 100 13 218 C2 | 6/2003 |
| DE | 10 2008 040156 A1 | 1/2010 |
| WO | 99/40285 A1 | 8/1999 |
| WO | 2012080778 A1 | 6/2012 |

* cited by examiner

*Primary Examiner* — Lisa Caputo
*Assistant Examiner* — Jamel Williams
(74) *Attorney, Agent, or Firm* — McGlew & Tuttle, P.C.

(57) ABSTRACT

A sensor includes at least a housing (3) which encloses a housing interior (6), a printed circuit board (8) and a sensing element (10). The printed circuit board (8) has electronic components (9) and is located within the housing interior (6). The sensing element (10) is electrically connected to the printed circuit board (8) and is located within the housing interior (6). The sensing element (10) is frictionally connected to the housing (3) so that the sensing element (10) is held in position in the housing interior (6).

17 Claims, 4 Drawing Sheets (B - B)

(A -A)

(B - B)

SENSOR

CROSS REFERENCE TO RELATED APPLICATIONS

This application claims the benefit of priority under 35 U.S.C. §119 of European Patent Application EP 12 177 898.9 filed Jul. 25, 2012, the entire contents of which are incorporated herein by reference.

FIELD OF THE INVENTION

The invention relates to a sensor including a housing, a printed circuit board, with electronic components, which is located within the housing and a sensing element and a process for the manufacture of a sensor.

BACKGROUND OF THE INVENTION

Sensors, for example, optical, inductive or capacitive sensors, are used in many different technical applications to establish physical or chemical parameters. The purpose of the housing is to protect electronic components on a printed circuit board as well as a sensing element from harmful environmental influences. The electronic components within the housing must be supplied with electrical current. For this reason, it is necessary to route electrical contacts through a housing wall of the housing in order to be able to supply the sensor from the outside with electrical current at an external part of the contact parts of the sensor.

In a fluid-tight version of the sensors, the printed circuit board with the electronic components and the sensing element are, as a rule, encased in a sealing compound. On the one hand, the sealing compound serves to fix the printed circuit board and the sensing element positively and interfacially, and on the other hand to keep out harmful environmental influences, for example, fluids, from the printed circuit board and the sensing element. This means that it is a fluid-tight sensor. Before the sensor is cast in the sealing compound, it is necessary to connect the printed circuit board and the sensing element with the housing, indirectly or directly, in order to position the printed circuit board and/or the sensing element with the help of the sealing compound while the compound is being poured into the inside of the housing. Before the sensor is cast in the sealing compound, the printed circuit board is generally also connected to the electrical contacts of the sensor, generally by means of soldering. In the event of a bonded connection between the printed circuit board and/or the sensing element and the housing before the sensor is cast in the sealing compound, this bonded connection is complex and expensive to produce and has low flexibility for different types of sensors.

DE 195 44 815 C1 discloses a sensor with an electric circuit mounted on a support, which is connected to an electrical connecting element and to a sensing element. Furthermore, it shows a housing with an interior for holding the support, the housing having openings for the connecting element as well as for the sensing element. The sensing element and a first part of the support are embedded in a duroplastic compound. A second part of the support and the electrical connecting element are enveloped by a thermoplastic compound. A seal is located in an intermediate space, adjacent to the opening for the sensing element, between the duroplastic compound and the housing.

DE 100 13 218 C2 discloses a process for the production of a position sensor, with a housing in the interior of which there is an electrical circuit mounted on a support, the process comprises the stages: the support is connected to a connector insert as an electrical connecting element to form a support-connecting element combination in which the connecting element is rigidly connected to the support, the support-connecting element combination is inserted into a housing, which is closed at one measuring end, from a rear end opposite the measuring end, the space around the support-connecting element combination in the interior of the housing is filled with a compound up to a certain level, a cap is connected to the rear end of the housing before the sealing compound has hardened, and the connections of the connecting element are routed through this cap, and the support-connecting element combination is fixed in the housing with this cap.

SUMMARY OF THE INVENTION

An object of the invention is to provide a sensor and a process for producing a sensor in which a printed circuit board and/or a sensing element can be fixed in the housing with little technical effort before the sealing compound is poured into the housing.

This task is solved with a sensor, comprising at least one housing which encloses a housing interior, a printed circuit board with electronic components which is located within the housing interior, a sensing element which is electrically connected to the printed circuit board and which is located within the housing interior, whereby the sensing element is frictionally connected to the housing so that the sensing element is held in position within the housing interior.

In the assembly of the sensor, therefore, the sensing element can first be fixed in the housing, easily and at reasonable cost, by means of a frictional connection, in particular, a snap-in, click or press connection. The interior of the housing can then be filled with a sealing compound, for example, a thermoplastic compound or casting resin.

In an additional embodiment, the printed circuit board is frictionally connected to the housing. In this case the printed circuit board and the sensing element can only be frictionally connected to the housing, in particular, apart from the adhesive connection on account of the sealing compound, and/or apart from a mechanical connection for the, in particular, exclusive, electrical connection of the printed circuit board and/or of the sensor element.

The housing is preferably designed as a housing pot and is essentially cuboid. The housing consists at least partially, in particular, completely, of metal and/or of synthetic material. The housing may have several parts. In particular, the housing can be designed as a translucent or opaque cap in the region of the sensing element. Preferably, the cap is made of synthetic material and the rest of the housing is made of metal. The sensor may be an optical, inductive or capacitive sensor. It is practical if the housing also has a housing cover. The printed circuit board comprises conductor tracks and the electronic components are electrically and mechanically connected to the printed circuit board. The printed circuit board is preferably located entirely within the housing interior enclosed by the housing. The printed circuit board and/or the sensing element may be completely enveloped by the sealing compound. This means that no harmful environmental influences, for example, a fluid, can reach the printed circuit board and/or the sensing element. In this case this is a liquid-tight or fluid-tight sensor, which in particular, is protected against splash water.

A supplementary variant includes at least one positive connection geometry on the housing and at least one counter-positive connection geometry on the printed circuit board, whereby at least one positive and one counter-positive connection geometry engage frictionally with each other to connect the printed circuit board to the housing. The printed circuit board can be fixed and positioned within the housing by means of the positive connection geometry on the housing and the counter-positive connection geometry on the printed circuit board before the sensor is cast in the sealing compound. The positive connection geometry is preferably designed as a connecting cam and/or a locking projection. An opening and/or a locking catch can be designed as a counter-positive connection geometry. The frictional connection is then preferably established on the basis of a press connection between the positive geometry and the counter-positive geometry.

In a particularly advantageous embodiment of the sensor to which the invention relates, there is an electrical printed circuit board contact element on at least one counter-positive connection geometry for the electrically conductive connection of the printed circuit board to the housing on at least one positive connection geometry. With this, an additional electrically conductive connection can be established between the printed circuit board and the housing. In this case, each electrical printed circuit board contact element can be designed as a metal ring. If the housing consists at least partly, in particular, completely, of metal, wired high-frequency interference can advantageously be conducted from the printed circuit board to the housing. If there is an additional frictional connection between the positive connection geometry and the counter-positive connection geometry or printed circuit board contact element, this electrical connection between the printed circuit board and the housing is particularly reliable, because on account of the frictional connection, for example, a press connection, there is always a mechanical and thus also an electrical contact between the printed circuit board contact element on the counter-positive connection geometry and the positive connection geometry, for example, the connecting cam.

In a supplementary embodiment, the sensing element is a coil and the sensor is an inductive proximity sensor, or the sensing element is an LED and/or a photo-transistor and the sensor is an optical sensor. The housing is preferably translucent at the LED and/or the photo-transistor.

In an additional embodiment, the sensing element is held with elastic pretension by means of an elastic element between the housing and the elastic element. Here, the elastic element can be designed as a spring.

One first end of the sensing element lies indirectly or directly on the housing, in particular, on the cap, and on account of the geometry of the housing, for example, as a recess, the sensing element is positively connected to the housing. A second end of the elastic element can also lie indirectly or directly on the sensing element. The first and second ends can be located opposite each other at the sensing element. The sensing element can comprise two sensor element contact elements for the electrical connection of the sensor element. The sensor element contact elements can also be electrically connected interfacially, for example, with a soldered connection, to the printed circuit board, in particular, to the printed circuit board contact elements. At the second end the sensing element is frictionally connected to the elastic element, for example, indirectly, with a connector part with elastic pretension. Elastic pretension of the elastic element is for example possible, in that, on account of a frictional connection, in particular, a press connection, between the positive and the counter-positive connection geometry, forces can be transferred from the elastic element to the printed circuit board and from the printed circuit board to the housing.

In an additional embodiment, the housing has a connector opening with which a connector sleeve is connected, in particular, frictionally. The frictional connection can be effected by means of a press connection. A connector part, for example, made of plastic, with electrical contact elements as electrical contacts, is located within the connector sleeve. The connector sleeve can be made of metal. Furthermore, a cable seal made of plastic through which electric power cables are routed as electrical contacts can be provided for at the connector opening.

For practical purposes the sensor comprises an optical fiber and a light transmitter, for example, an LED, so that light generated by the light transmitter can be conducted from the light transmitter through the optical fiber and outside the sensor. The optical fiber is preferably located outside on two or three sides of the sensor, so that the light emitted by the light transmitter is visible on two or three sides of the sensor.

A process in accordance with the invention to produce a sensor, in particular, a sensor as described in this industrial property right application, comprises the following steps:

provision of a housing, provision of a printed circuit board with electronic components, provision of a sensing element, insertion of the sensing element into a housing interior enclosed by the housing, whereby the sensing element at one first end lies indirectly or directly on the housing, in particular, on the cap, and on account of the geometry of the housing, preferably as a recess, the sensing element is positively connected to the housing, insertion of the printed circuit board into a housing interior enclosed by the housing, whereby a positive connection geometry located on the housing and a counter-positive connection geometry located on the printed circuit board frictionally engage with each other to connect the printed circuit board with the housing, whereby the sensing element is kept elastically pretensioned by means of an elastic element between the housing and the elastic element.

This means that in an advantageous manner, for example, no complex bonded connection is required between the printed circuit board and/or the sensing element before the sealing compound is poured into the housing.

In particular, a frictional connection which serves to connect the printed circuit board and/or the sensing element electrically, for example, with the contacts for the electrical supply of the sensor, is not taken into account. Such mechanical connections for an electrical connection also represent mechanical connections, but on account of their mechanical properties cannot provide any contribution, or any essential contribution, towards an adequate mechanical strengthening or positioning of the printed circuit board and/or of the sensing element before the sealing compound is poured into the housing.

The housing can be created by means of injection molding, e.g. of plastic, in particular, thermoplastic, or of metal, e.g. zinc or a zinc alloy, and the housing is preferably coated after the injection molding, in particular, by means of galvanizing, e.g. with metal, in particular, nickel.

For practical purposes, the housing is provided as a housing pot and/or the housing is provided with a cap opening and/or the housing is provided with a connector opening, and in particular, at least one press shoulder, preferably two press shoulders, are formed at the connector opening.

The cap opening can be closed with a cap, and in particular, the cap can be connected to the housing positively and/or frictionally, for example, with a snap-on connection, in particular, before the sealing compound is poured into the housing.

Furthermore, a connector sleeve can be inserted into the connector opening, whereby the connector sleeve is connected to the housing at the connector opening with a positive and/or frictional connection, in particular, a press connection, so that in particular, at least one counter-press shoulder, preferably at least two counter-press shoulders, lie on the connector sleeve on at least one press shoulder, preferably two press shoulders, at the connector opening of the housing, in particular, before the sealing compound is poured into the housing.

A cable seal can be inserted into the connector opening and connected positively and/or frictionally and/or interfacially with the housing at the connector opening, in particular, before the sealing compound is poured into the housing. On account of the press shoulder on the housing and the counter-press shoulder on the connector sleeve, preferably made of metal, this can allow an adequate press connection to be provided and established with low housing wall thickness at the connector opening. The press shoulder and the counter-press shoulder thus provide an additional press surface to supplement the normal press opening at the connector opening of the relevant housing wall, for example, the rear wall, of the housing.

In a further variant, a connector part, e.g. made of plastic, with the electrical contact elements as contacts, is inserted into the connector sleeve and connected to the connector sleeve positively and/or frictionally and/or interfacially, in particular, after the connector sleeve has been connected to the housing at the connector opening, in particular, before the sealing compound is poured into the housing. Power cables can be routed through a cable opening, in particular, after the cable seal has been connected to the housing at the connector opening, in particular, before the sealing compound is poured into the housing.

In an additional embodiment, the sensing element is connected to the housing in that the sensing element is kept elastically pretensioned between the housing, in particular, the cap, and an elastic element, in particular a spring, in particular, before the sealing compound is poured into the housing, and/or the printed circuit board is placed on at least one housing shoulder, in particular, at least two housing shoulders, in particular, before the sealing compound is poured into the housing, and/or the printed circuit board is positively connected to the housing with at least one positive connection geometry on at least one counter-positive connection geometry, and in particular, at least one connecting cam, preferably two connection cams on the housing are inserted into at least one opening, in particular, two openings on the printed circuit board, in particular, before the sealing compound is poured into the housing.

In a supplementary variant, the at least one positive connection geometry on the printed circuit board is additionally frictionally connected to the at least one counter-positive connection geometry on the printed circuit board, in particular, in that at least one connecting cam on the housing is pressed together with the printed circuit board at the opening, in particular, before the sealing compound is poured into the housing, and/or the elastic element is interfacially connected to the printed circuit board, for example, by soldering, and/or the sensing element contact elements on the sensing element are connected electrically to the printed circuit board, in particular, in that the sensing element contact elements are soldered to printed circuit board contact elements, in particular, before the sealing compound is poured into the housing, and/or the electrical contacts are electrically connected to the printed circuit board, in particular, in that the contacts are soldered to printed circuit board contact elements, in particular, before the sealing compound is poured into the housing.

In an additional embodiment, an optical fiber, in particular, before the sealing compound is poured into the housing, is frictionally connected to the housing, for example, with a snap-on connection, in particular, before the sealing compound is poured into the housing.

For practical purposes the housing pot comprises only one opening for inserting the printed circuit board.

In a further embodiment, the sensor is fluid-tight, and in particular, the printed circuit board with electronic components and/or the sensing element are enveloped or embedded by the sealing compound so that they are fluid-tight.

An embodiment of the invention is described in greater detail in the following, with reference to the enclosed drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 7:
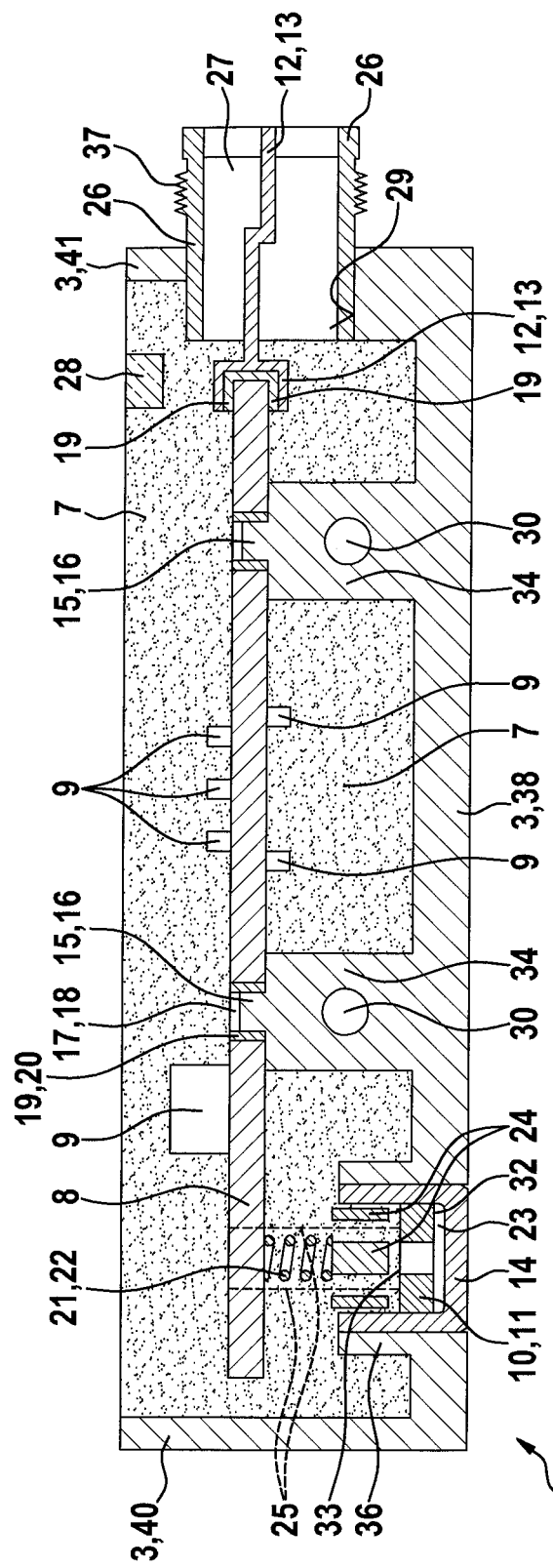
FIG. 7 is a longitudinal section of the sensor.
Figure 8:
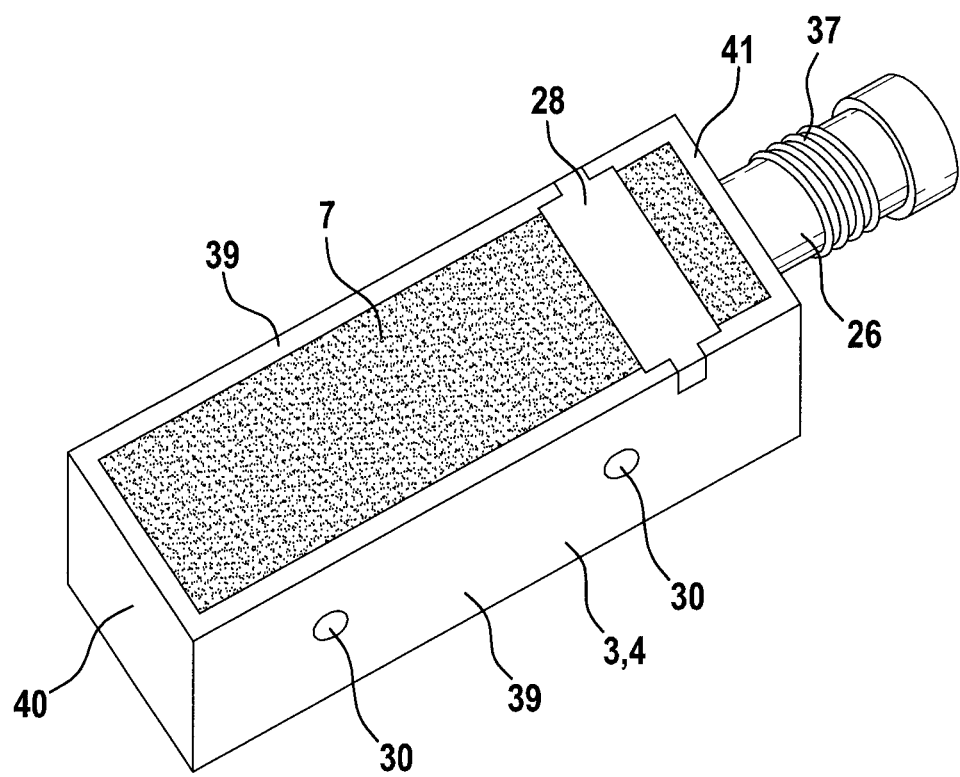
FIG. 8 is a perspective view of the sensor in accordance with FIG. 7.

Referring to the drawings in particular, a sensor 1 shown in FIGS. 7 and 8 is designed as an inductive sensor 2 and thus represents a proximity sensor. With the inductive sensor 2, objects within its range or in its proximity can be detected.

Figure 1:
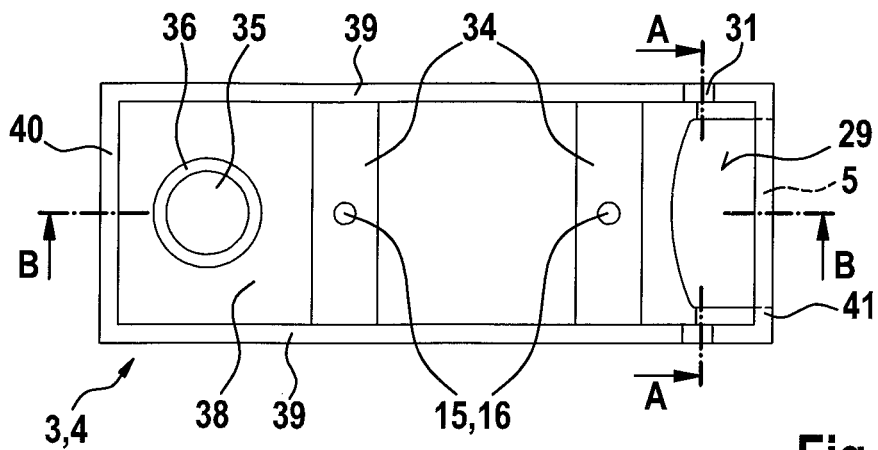
FIG. 1 is a top view of the housing of the sensor.
Figure 2:
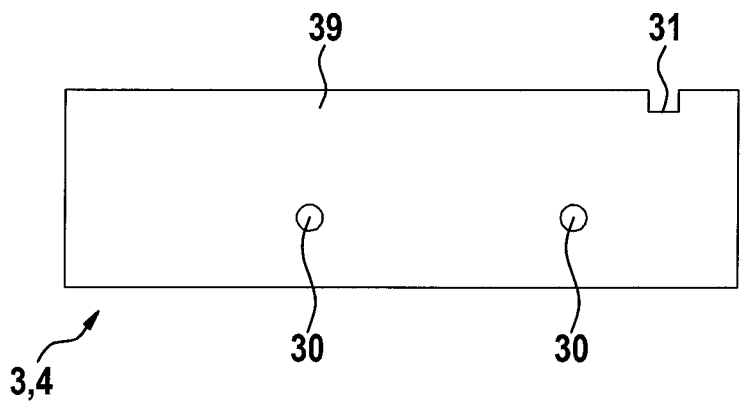
FIG. 2 is a side view of the housing in accordance with FIG. 1.
Figure 3:
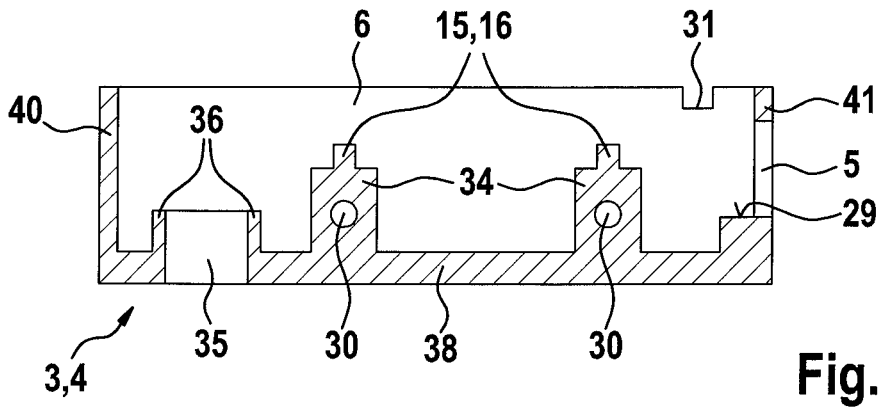
FIG. 3 is a longitudinal section B-B of the housing in accordance with FIG. 1.
Figure 4:
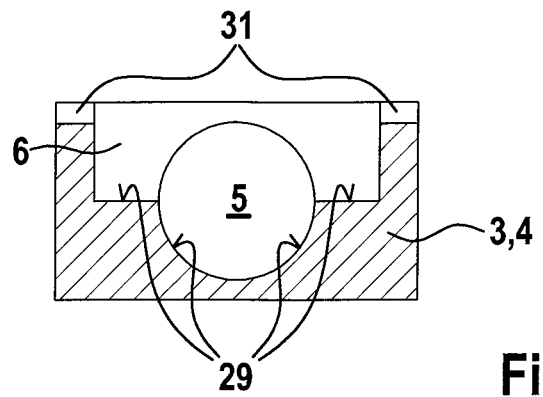
FIG. 4 is a cross-section A-A of the housing in accordance with FIG. 1.

The sensor 1,2 comprises a housing 3, which is designed as a housing pot 4 (shown in FIG. 3). The housing 3 consists of metal, namely a zinc alloy, and is produced by means of a zinc die-casting process. The housing pot 4 (FIGS. 1 to 4) encloses a housing interior 6. The housing interior 6 is bordered by a base wall 38, two side walls 39, a front wall 40 and a rear wall 41 of the housing pot 4. Two housing shoulders 34 are formed on the base wall 38 in a transverse direction. On the top side of each of the housing shoulders 34 a connecting cam 16 for positioning a printed circuit board 8 is formed as a positive connection geometry 15. A mounting hole 30 is drilled in each of the two shoulders 34 in a transverse direction. The mounting holes 30 preferably have a thread.

Furthermore, the base wall 38 has a cap opening 35. The housing 3 has a cap ring 36 at the cap opening 35. A connector opening 5 on the rear wall 41 serves to insert a connector sleeve 26. A press shoulder 29 is formed on the housing 3 in the area of the connector opening 5 on the underside. The press shoulder 29 serves to create an additional press surface between the housing 3 and the connector sleeve 26 in the creation and connection of the connector sleeve 26 to the housing 3 at the connector opening 5.

The two side walls 39 have two housing cutouts 31 on the top side for an optical fiber 28.

On the top side of the printed circuit board 8 (FIGS. 5 and 6) four electronic components 9, for example, a controller and an electrical resistor, are mechanically and electrically connected to the printed circuit board 8. For this purpose, the printed circuit board 8 has conductor tracks, which are not illustrated. On the underside of the printed circuit board 8 (FIG. 6) two electronic components 9 are mechanically and electrically connected to the printed circuit board 8. The printed circuit board 8 made of plastic has two openings 18, which form a counter-positive connection geometry 17. At these openings 18 in the printed circuit board 8 metal rings 20 are additionally located as printed circuit board contact elements 19. The metal rings 20 are electrically conductively connected to the appropriate connecting cams 16. With this, interference voltage can advantageously be discharged via the housing 3.

A spring 22 is also attached to the underside of the printed circuit board 8 as an elastic element 21. In this embodiment, the attachment is effected by means of a soldered connection.

Figure 5:
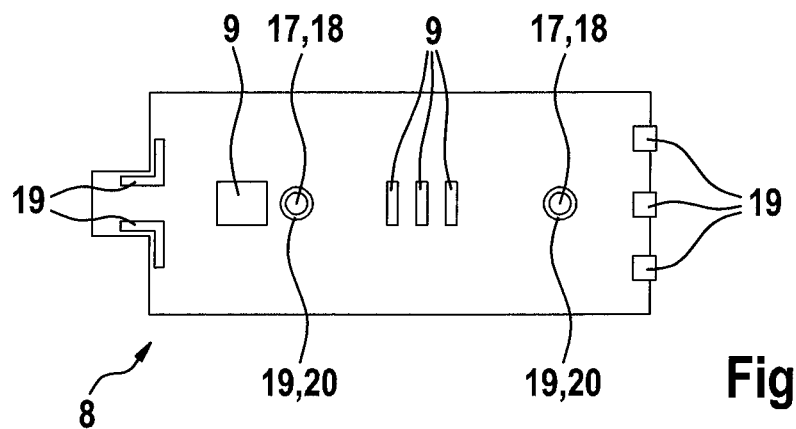
FIG. 5 is a top view of a printed circuit board of the sensor.

The printed circuit board 8 also has three printed circuit board contact elements 19 on the top, in accordance with the illustration in FIG. 5 on the right. The cross-section of the three printed circuit board contact elements 19 is U-shaped (FIG. 7) and is thus also present on the underside and thus also visible in FIG. 6.

Through the zinc die-casting process used to produce the housing pot 4, the geometry described above of the housing pot 4, for example, with the housing shoulders 34 and the cap opening 35 with the cap ring 36, can already simply be produced in the die-casting process, without any subsequent post-processing, for example, machining, being necessary.

A cap 14 made of plastic is then pushed and pressed into the cap opening 35 on the base wall 38 of the housing 3, so that a positive and/or frictional connection is established between the cap 14 and the cap ring 36 on the housing 3. The cap ring 36 provides a relatively large connecting surface between the cap 14 and the housing 3, that is, the cap ring 36. The metal connector sleeve 26 is then pushed and pressed into the connector opening 5 on the rear wall 41, so that a press connection is established between the connector sleeve 26 and the housing 3. On account of the press shoulder 29 on the housing 3 and a counter-press shoulder on the connector sleeve 26, a large press connection surface is available between the connector sleeve 26 and the housing 3. This means that the thickness of the rear wall 41 is the same as that of the other walls of the housing 3. After the press connection has been established between the connector sleeve 26 and the housing 3, a connector part 27 made of plastic is pushed into the connector sleeve 26. The connector part 27 is made of thermoplastic using the injection molding method. Three electrical contact elements 13 are surrounded by the plastic of the connector part 27 in the injection molding process as electrical contacts 12.

The electrical contact elements 13 serve to connect the sensor 1 electrically with the environment. Three electrical contact elements 13 are integrated in the connector part 27, but only one electrical contact element 13 is illustrated due to the cross-section in FIG. 7. The electrical contact elements 13 are located outside the sensor 1 at the right-hand end illustrated in FIG. 7 and can thus be connected mechanically and electrically with appropriate electrical contact counter-elements (not illustrated). For this purpose, a suitable electrical counter-connector (not illustrated) must be screwed onto a male thread 37 of the connector sleeve 26. This allows the electrical contact counter-elements to be connected to the electrical contact elements 13.

The connector part 27 is connected positively and/or frictionally to the connector sleeve 26, for example, by means of a snap-on connection.

A coil 11 is then placed on the cap 14 as a sensing element 10 for the inductive sensor 2.

In further embodiments, in particular, with optical sensors (not described here) the sensing element 10 can be formed as an LED and/or a photo-transistor.

The cap 14 has an appropriate geometry, so that a recess 23 whose form is complementary to the geometry of the coil 11 is formed on the inside of the cap 14. This ensures that the coil 11 is held in a positive connection in the recess 23 of the cap 14.

The printed circuit board 8 is subsequently placed on the housing 3 in that the two connecting cams 16 are first inserted into the two openings 18 in the printed circuit board 8 and the printed circuit board 8 is then placed on the two housing shoulders 34. This establishes a positive connection between the printed circuit board 8 and the housing 3 at the connecting cams 16 as well as at the housing shoulders 34. In addition, a press connection is established between the connecting cams 16 and the opening 18 on the printed circuit board 8 by means of a suitable tool. The openings 18 each have metal rings 20 on the printed circuit board 8. This establishes a frictional connection between the housing 3 and the printed circuit board 8.

The coil 11 is mounted on the cap 14. An intermediate part 24 is in turn intended for placing on a second end 33, the upper end of the coil 11, in accordance with the illustration in FIG. 7. The intermediate part 24 is made of plastic.

Placing the printed circuit board 8 on the housing 3 causes the spring 22 to be placed on the intermediate part 24 and the spring 22 to be elastically pretensioned, so that the coil 11 is indirectly attached to the printed circuit board 8 with elastic pretension with the spring 22 by means of the intermediate part 24. A first end 32 of the coil 11 is in contact with the cap 14. In accordance with the illustration in FIG. 7, the first end 32 represents a lower end of the coil 11. The coil 11 is thus secured between the printed circuit board 8 and the cap 14 under pretension. This means that the printed circuit board 8 as well as the coil 11 are positioned with respect to the housing 3 and mounted on the same before the sealing compound 7 is poured into the housing.

For the electrical connection between the coil 11 and the printed circuit board 8, the coil 11 has two contact elements 25 to connect the coil 11; these are shown in FIG. 7 as dotted lines. These two contact elements 25 for connecting the coil 11 are then soldered to the two printed circuit board contact elements 19 shown on the left in FIG. 5, so that the coil 11 is electrically and to a lesser extent mechanically connected to the printed circuit board 8 or to the printed circuit board contact elements 19.

Figure 6:
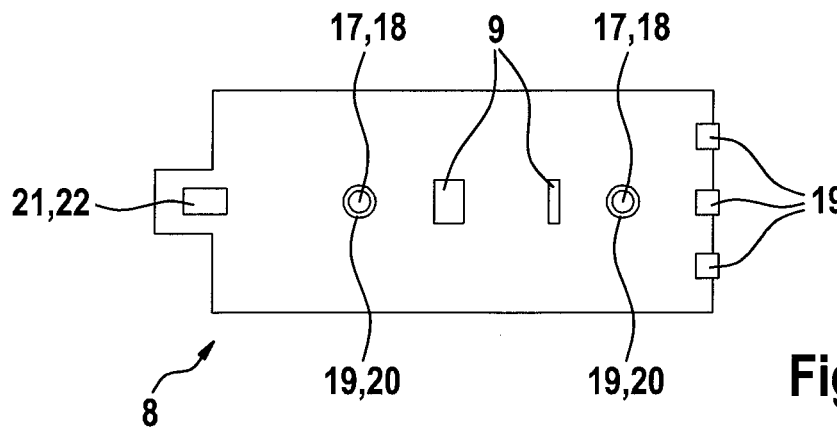
FIG. 6 is a rear view of the printed circuit board in accordance with FIG. 5.

In addition, the three electrical contact elements 13 on the connector part 27, the left-hand inner ends of which end in the housing interior 6 enclosed by the housing 3, are soldered to the three printed circuit board contact elements 19 shown on the right in FIGS. 5 and 6, so that the printed circuit board 8 is electrically connected to the three electrical contact elements 13 and thus the sensor 1 also has an electrical connection to the outside.

Before the sealing compound 7 is poured into the housing, an optical fiber 28 made of a light-conducting synthetic material is also connected to the two housing cutouts 31 on the top of the two side walls 39, for example, by means of a clip or snap-on connection.

The sealing compound 7 is then poured into the housing interior 6, so that the printed circuit board 8 and the coil 11 are completely enclosed by the sealing compound 7. The sensor 1 thus represents a fluid-tight sensor 1.

In a further embodiment, not illustrated, a cable seal is located in the connector opening 5 instead of the connector sleeve 26 and the connector part 27. Here, the cable seal is formed as a connecting piece with a cable opening, and three power cables can be routed through this cable opening as electrical contacts 12. These power cables are soldered at one end with the three printed circuit board contact elements 19 shown on the right in FIGS. 5 and 6. At the right-hand end of the power cables, these can be connected to an appropriate unit outside the sensor 1, for example, by means of an electrical screw connection.

The interspace or free space between the cable opening and the power cables is sealed and closed when the sealing compound 7 is poured into the housing.

The fluidity or viscosity of the sealing compound 7 before it hardens is designed in such a way that no, or practically no, sealing compound 7 can flow out of these remaining openings through the cable opening.

On the whole, it can be said that significant advantages are associated with the sensor 1 to which the invention relates and the process to which the invention relates for producing the sensor 1.

The printed circuit board 8 and the coil 11 are connected positively and frictionally indirectly or directly with the housing 3 before the sealing compound 7 is poured into the housing. This allows the printed circuit board 8 and the coil 11 to be held simply and at low cost in the housing 3 and thus positioned in the housing interior 6 before the sealing compound 7 is poured into the housing. Complex bonded connections between the printed circuit board 8 and/or the coil 11 before the sealing compound 7 is poured into the housing are thus not necessary. Furthermore, different sensors 1 can thus be flexibly and advantageously produced using the same manufacturing process.

While specific embodiments of the invention have been shown and described in detail to illustrate the application of the principles of the invention, it will be understood that the invention may be embodied otherwise without departing from such principles.

What is claimed is:

1. A sensor comprising:
   a housing enclosing a housing interior;
   a printed circuit board with electronic components, the printed circuit board being located within the housing interior;
   a sensing element electrically connected to the printed circuit board, the sensing element being located within the housing interior, the sensing element being frictionally connected to the housing by a frictional connection so that the sensing element is held in position in the housing interior; and
   an elastic element maintaining the sensing element elastically pretensioned between the housing and the elastic element, wherein the elastic element is connected to and held onto the printed circuit board, said elastic element comprising a spring, wherein one end of said spring is located adjacent to the printed circuit board and another end of said spring is in contact with an intermediate part, said sensing element comprising a coil, wherein one end of said coil is in contact with said intermediate part and another end of said coil is in contact with a cap, said cap being arranged in an opening of said housing, wherein said cap is in contact with said housing, said frictional connection being defined at least by said cap and said another end of said coil.

2. A sensor in accordance with claim 1, wherein the printed circuit board is frictionally connected to the housing.

3. A sensor in accordance with claim 2, wherein:
   the housing comprises a positive connection geometry; and
   the printed circuit board comprises a counter-positive connection geometry, the positive connection geometry and the counter-positive connection geometry defining a positive connection wherein the positive connection geometry and the counter-positive connection geometry engage frictionally with each other to connect the printed circuit board with the housing.

4. A sensor in accordance with claim 3, wherein the positive connection geometry comprises at least one of a connecting cam and a locking projection.

5. A sensor in accordance with claim 3, wherein the counter-positive connection geometry comprises at least one of an opening and a locking catch.

6. A sensor in accordance with claim 3, wherein the frictional connection is effected on the basis of a press connection between the positive connection geometry and the counter-positive connection geometry.

7. A sensor in accordance with claim 6, wherein the counter-positive connection geometry includes an electrical printed circuit board contact element and the positive connection geometry includes a contact element to establish an electrically conductive connection between the printed circuit board and the housing.

8. A sensor in accordance with claim 1, wherein the elastic element is connected to and held onto the printed circuit board by an solder connection.

9. A sensor in accordance with claim 1, wherein the elastic element is electrically conductive and is formed to establish an electrical connection between the sensing element and the printed circuit board.

10. A sensor in accordance with claim 9, wherein:
    the sensing element has a first end that lies indirectly or directly on the housing or on a cap connected to the housing, wherein the housing or the cap of the housing has a geometry or a recess that defines at least one of a positive connection or a friction connection with the sensing element;
    the elastic element has an end that lies indirectly or directly on the sensing element;
    the sensing element has a second end located opposite to the first end of the sensing element;
    the sensing element comprises a contact element for the electrical connection of the sensing element with the printed circuit board; and the contact element is electrically connected interfacially, via a soldered connection, to a printed circuit board contact element.

11. A sensor in accordance with claim 1, wherein:
the sensor comprises an optical fiber and a LED light transmitter, whereby light produced by the light transmitter is conducted outside the sensor from the light transmitter through the optical fiber; and
the optical fiber is located on an outside on two or three sides of the sensor, whereby light radiated by the light transmitter is visible on two or three sides of the sensor.

12. A process for producing a sensor, the process comprising the steps of:
providing a housing enclosing a housing interior;
providing a printed circuit board with electronic components;
providing a sensing element;
inserting the sensing element in the housing interior enclosed by the housing;
positioning the sensing element such that a first end of the sensing element lies indirectly or directly on the housing or on a cap of the housing, wherein the housing or the cap of the housing has a geometry or a recess that defines at least one of a positive connection or providing a counter-positive connection geometry on the printed circuit board;
inserting the printed circuit board into a housing interior such that it is enclosed by the housing;
frictionally engaging the positive connection geometry on the housing and the counter-positive connection geometry on the printed circuit board with each other to connect the printed circuit board to the housing;
providing an the elastic element; and
maintaining the sensing element elastically pretensioned, by means of the elastic element, between the housing and the elastic element, wherein said elastic element comprises a spring, one end of the spring being soldered onto the printed circuit board in a printed circuit board component mounting process, wherein said one end of said spring is located adjacent to the printed circuit board, another end of said spring being in contact with an intermediate part, said sensing element comprising a coil, wherein one end of said coil is in contact with said intermediate part and another end of said coil is in contact with said cap or said housing, said positive connection or frictional connection being defined at least by said housing or said cap and said another end of said coil.

13. A process in accordance with claim 12, wherein:
the printed circuit board is placed on at least one of a single housing shoulder and two housing shoulders; and
subsequently sealing compound is poured into the housing.

14. A sensor comprising:
a housing enclosing a housing interior;
a printed circuit board with electronic components, the printed circuit board being located within the housing interior;
a sensing element electrically connected to the printed circuit board, the sensing element being located within the housing interior, the sensing element having a first end that lies indirectly or directly on the housing or on a cap of the housing, wherein the housing or the cap of the housing has a geometry or a recess that defines at least one of a positive connection or a friction connection with the sensing element; and
an elastic element maintaining the sensing element elastically pretensioned between the housing and the elastic element, wherein the elastic element is electrically conductive and is formed to establish an electrical connection between the sensing element and the printed circuit board, said elastic element comprising a spring, one end of said spring being in contact with the housing or the cap and another end of said spring being in contact with an intermediate part, said sensing element comprising a coil, wherein one end of said coil is in contact with said intermediate part and another end of said coil is in contact with said cap or said housing, said positive connection or said frictional connection being defined at least by said housing or said cap and said another end of said coil.

15. A sensor in accordance with claim 14, wherein:
the housing comprises a positive connection geometry; and
the printed circuit board comprises a counter-positive connection geometry, the positive connection geometry and the counter-positive connection geometry defining a positive connection wherein the positive connection geometry and the counter-positive connection geometry engage frictionally with each other to connect the printed circuit board with the housing.

16. A sensor in accordance with claim 15, wherein:
the positive connection geometry and the counter-positive connection geometry engage frictionally on the basis of a press connection between the positive connection geometry and the counter-positive connection geometry; and
the counter-positive connection geometry includes an electrical printed circuit board contact element and the positive connection geometry includes a contact element to establish an electrically conductive connection between the printed circuit board and the housing.

17. A sensor in accordance with claim 14, wherein:
the sensor comprises an optical fiber and a LED light transmitter, whereby light produced by the light transmitter is conducted outside the sensor from the light transmitter through the optical fiber; and
the optical fiber is located on an outside on two or three sides of the sensor, whereby light radiated by the light transmitter is visible on two or three sides of the sensor.

* * * * *